(12) United States Patent
Jung et al.

(10) Patent No.: US 7,303,858 B2
(45) Date of Patent: *Dec. 4, 2007

(54) PHOTOACID GENERATING POLYMER, ITS PREPARATION METHOD, TOP ANTI-REFLECTIVE COATING COMPOSITION COMPRISING THE SAME, METHOD OF FORMING A PATTERN IN A SEMICONDUCTOR DEVICE, AND SEMICONDUCTOR DEVICE

(75) Inventors: Jae Chang Jung, Seoul (KR); Cheol Kyu Bok, Gyunggi-do (KR); Chang Moon Lim, Gyunggi-do (KR); Seung Chan Moon, Gyunggi-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 117 days.

This patent is subject to a terminal disclaimer.

(21) Appl. No.: 11/168,102

(22) Filed: Jun. 28, 2005

(65) Prior Publication Data

US 2006/0127804 A1  Jun. 15, 2006

(30) Foreign Application Priority Data

Dec. 15, 2004  (KR)  .................. 10-2004-0106672

(51) Int. Cl.
| G03F 7/095 | (2006.01) |
| G03F 7/11  | (2006.01) |
| G03F 7/38  | (2006.01) |
| G03F 7/30  | (2006.01) |
| G03F 7/20  | (2006.01) |

(52) U.S. Cl. ............... 430/311; 430/273.1; 430/272.1; 430/904; 430/950; 430/961; 526/243; 526/259; 522/904

(58) Field of Classification Search ............... 526/243, 526/259; G03F 7/095
See application file for complete search history.

(56) References Cited

U.S. PATENT DOCUMENTS

| 5,252,686 | A | * | 10/1993 | Aoai et al. ............. 525/480 |
| 5,744,537 | A | * | 4/1998  | Brunsvold et al. ...... 524/520 |
| 5,879,853 | A |   | 3/1999  | Azuma |
| 6,028,153 | A | * | 2/2000  | Jung .................... 526/258 |
| 6,057,080 | A |   | 5/2000  | Brunsvold et al. |
| 6,534,237 | B1| * | 3/2003  | Kawamura et al. ...... 430/270.1 |
| 6,692,884 | B2| * | 2/2004  | Fujimori et al. ........ 430/170 |
| 6,783,912 | B2|   | 8/2004  | Cameron et al. |
| 6,849,374 | B2|   | 2/2005  | Cameron et al. |
| 2003/0162120 | A1 | * | 8/2003 | Yoon et al. .............. 430/156 |
| 2006/0127803 | A1 | * | 6/2006 | Jung et al. ............. 430/270.1 |
| 2006/0275695 | A1 | * | 12/2006 | Jung et al. ............. 430/270.1 |

FOREIGN PATENT DOCUMENTS

| JP | 09-227634      | 9/1997 |
| JP | 2001-199955    | 7/2001 |
| JP | 2003-122012    | 4/2003 |
| JP | 2003-202673    | 7/2003 |
| JP | 2003-261529    | 9/2003 |
| KR | 10-2004-0004429| 1/2004 |

* cited by examiner

*Primary Examiner*—Cynthia Hamilton
(74) *Attorney, Agent, or Firm*—Marshall, Gerstein & Borun LLP

(57) ABSTRACT

Disclosed herein is a photoacid generating polymer represented by Formula 1 below:

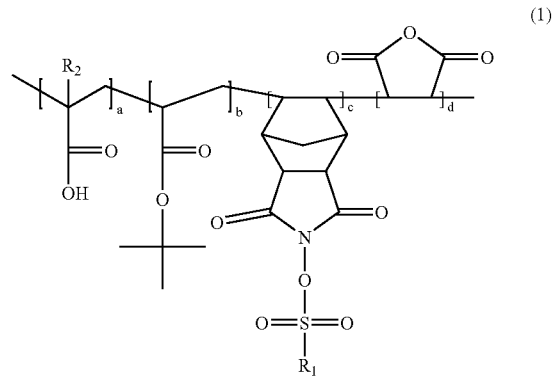

(1)

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c and d represent the mole fraction of each monomer and are in the range between about 0.05 and about 0.9, such that the sum of a, b, c, and d equals one. Since the photoacid generating polymer of Formula 1 is not water-soluble and acts as a photoacid generator, it can be used to prepare a top anti-reflective coating composition for immersion lithography.

26 Claims, 2 Drawing Sheets

PHOTOACID GENERATING POLYMER, ITS PREPARATION METHOD, TOP ANTI-REFLECTIVE COATING COMPOSITION COMPRISING THE SAME, METHOD OF FORMING A PATTERN IN A SEMICONDUCTOR DEVICE, AND SEMICONDUCTOR DEVICE

BACKGROUND

1. Technical Field

This disclosure relates to a photoacid generating polymer used in photolithography, which is one fabrication process for a semiconductor device; a method for preparing a photoacid generating polymer; and an anti-reflective coating composition comprising the photoacid generating polymer. More specifically, the disclosure relates to a photoacid generating polymer suitable for use in immersion lithography for the fabrication of sub-50 nm semiconductor devices, a method for preparing these photoacid generating polymers, and a top anti-reflective coating composition comprising the photoacid generating polymer.

2. Description of the Related Art

Photolithography is a process for the transfer of a semiconductor circuit pattern formed on a photomask to a wafer, and is one of the most important processes in determining the fineness and integration density of circuits in the fabrication of semiconductor devices.

In recent years, as the integration density of semiconductor devices has increased, new techniques have been developed to adapt to the fine processing required in the fabrication of semiconductor devices. There is an increasing need for fine processing techniques in photolithography processes. As the circuit line widths are becoming finer and finer, the use of short-wavelength light sources for illumination and high numerical aperture lenses is required. Non-limiting examples of such short wavelength light sources are EUV, F2, ArF and KrF excimer lasers, listed in decreasing order of preference.

A number of studies on the development of sub-50 nm devices have been undertaken. Recent attention has been directed toward the development of suitable processing equipment and materials associated with the use of F2 and EUV as exposure light sources. Several issues arise from the use of EUV and F2 lasers as light sources. Technical solutions for the use of F2 are satisfactory to some extent. However, high-quality $CaF_2$ is difficult to produce on an industrial scale within a short time. Also, since soft pellicles are likely to be deformed upon exposure to light at 157 nm, the lifetime of the light source is short. Hard pellicles incur considerable production costs, and are difficult to produce on a commercial scale due to the nature of light refraction. EUV lasers have their own drawbacks. Suitable light sources, exposure equipment and masks are required for EUV laser use, making their application impractical. Accordingly, the formation of finer high-precision photoresist patterns by using a photoresist adapted to the use of an ArF excimer laser is of importance.

Dry lithography is an exposure system wherein air is filled between an exposure lens and a wafer. In contrast to dry lithography, immersion lithography, which corresponds to an NA scaling technique, is an exposure system wherein water is filled between an exposure lens and a wafer. Since water (with a refractive index (n) of=1.4) is used as the medium for a light source in the immersion lithography, the NA is 1.4 times larger than that of dry lithography using air (refractive index (n)=1.0). Accordingly, immersion lithography is advantageous in terms of its high resolution.

A problem encountered with the fabrication of a sub-50 nm semiconductor device is that alteration of the critical dimension (CD) of a photoresist pattern inevitably occurs during the process for the formation of this ultrafine pattern. These alterations arise from standing waves, reflective notching, and diffracted and reflected light from an underlying layer due to the optical properties of the underlying layer on an overlying photoresist and due to the variation in the thickness of the photoresist. To prevent light from reflecting off the underlying layer, an anti-reflective coating is introduced between the photoresist and the underlying layer. The anti-reflective coating is composed of a material that absorbs light in the range of wavelengths used by the exposure light source. Previous treatments have placed this anti-reflective coating on the bottom, interposed between the underlying layer and the photoresist. With the recent increase in the fineness of photoresist patterns, a top anti-reflective coating (TARC) has also been developed in order to prevent the photoresist pattern from being disrupted by the reflected and diffracted light. Specifically, as remarkable miniaturization of semiconductor devices makes photoresist patterns extremely fine, the use of a bottom anti-reflective coating alone cannot completely prevent the patterns from being disrupted by scattered reflection. Accordingly, a top anti-reflective coating is introduced to prevent the disruption of the patterns.

However, since conventional top anti-reflective coatings for use in dry lithography are water-soluble, they cannot be applied to immersion lithography. In other words, since water is used as a medium for a light source in immersion lithography, it easily dissolves the conventional top anti-reflective coatings. Accordingly, there is need for the development of a top anti-reflective coating for use in immersion lithography that is compatible with immersion lithography. This new top anti-reflective coating must satisfy the following requirements. The top anti-reflective coating must be transparent to a light source and have a refractive index between 1.5 and 1.65, depending on the kind of an underlying photosensitive film (i.e., photoresist) to be used. When the top anti-reflective coating composition is coated on an underlying photosensitive film, it must not dissolve the photosensitive film. The top anti-reflective coating must not be soluble in water upon light exposure, but must be soluble in a developing solution. Finally, the top anti-reflective coating must enable the formation of a vertical pattern for creation of the photoresist.

The above-mentioned stringent requirements make the development of a suitable top anti-reflective coating for use in immersion lithography difficult. One of the sources of this difficulty arises from the conventional top anti-reflective coatings inability to allow for the desired formation of a photoresist pattern. Thus, there exists a strong need for the development of a top anti-reflective coating for use in immersion lithography which is water-insoluble and enables the formation of a vertical pattern upon formation of a semiconductor pattern.

SUMMARY OF THE DISCLOSURE

A photoacid generating polymer is disclosed which is water insoluble and, therefore, can be used in immersion lithography. Further properties of this photoacid generating pholymer include its ability to prevent the multiple interference of light inside a photoresist in the formation of a photoresist pattern, its inhibition of any alteration in the dimensions of the photoresist pattern resulting from the variation in the thickness of the photoresist, and its ability to enable the formation of a vertical semiconductor pattern.

A method for preparing a photoacid generating polymer, a top anti-reflective coating composition comprising a photoacid generating polymer, and a method for forming a pattern by using the top anti-reflective coating composition are also disclosed.

A disclosed photoacid generating polymer is represented by Formula 1 below:

Formula 1

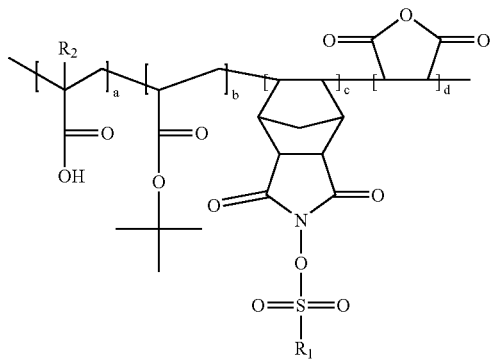

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c and d represent the mole fraction of each monomer and are in the range between about 0.05 and about 0.9, such that the sum of a, b, c, and d equals one.

A method for preparing a poly(methylmethacrylic acid-t-butylacrylate-maleic anhydride-N-[(perfluoroalkanesulfonyl)oxy]-norbornene-2,3-dicarboximide) includes dissolving a methylmethacrylic acid monomer, a t-butylacrylate monomer, a maleic anhydride monomer, an N-[(perfluoroalkanesulfonyl)oxy]-norbornene-2,3-dicarboximide monomer and a polymerization initiator in an organic solvent, and subjecting the monomers to free-radical polymerization.

In accordance with another aspect of the disclosure, there is provided a top anti-reflective coating composition comprising a photoacid generating polymer represented by Formula 1 below:

(1)

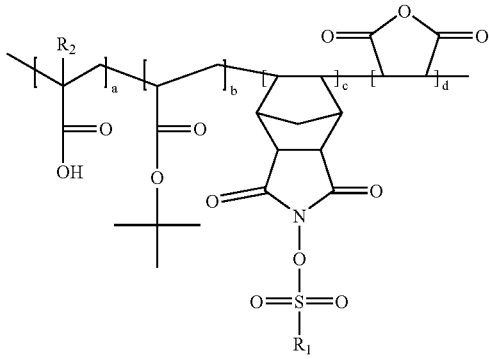

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c and d represent the mole fraction of each monomer and are in the range between about 0.05 and about 0.9, such that the sum of a, b, c, and d equals one.

In accordance with yet another aspect of the disclosure, there is provided a method for forming a pattern of a semiconductor device comprising the steps of: (a) applying a photoresist to a semiconductor substrate on which a particular underlying structure is formed; (b) applying a top anti-reflective coating composition on top of the photoresist to form a top anti-reflective coating; and (c) exposing the photoresist to light, followed by developing, to form a photoresist pattern.

DETAILED DESCRIPTION OF THE PRESENTLY PREFERRED EMBODIMENTS

Figure 1:
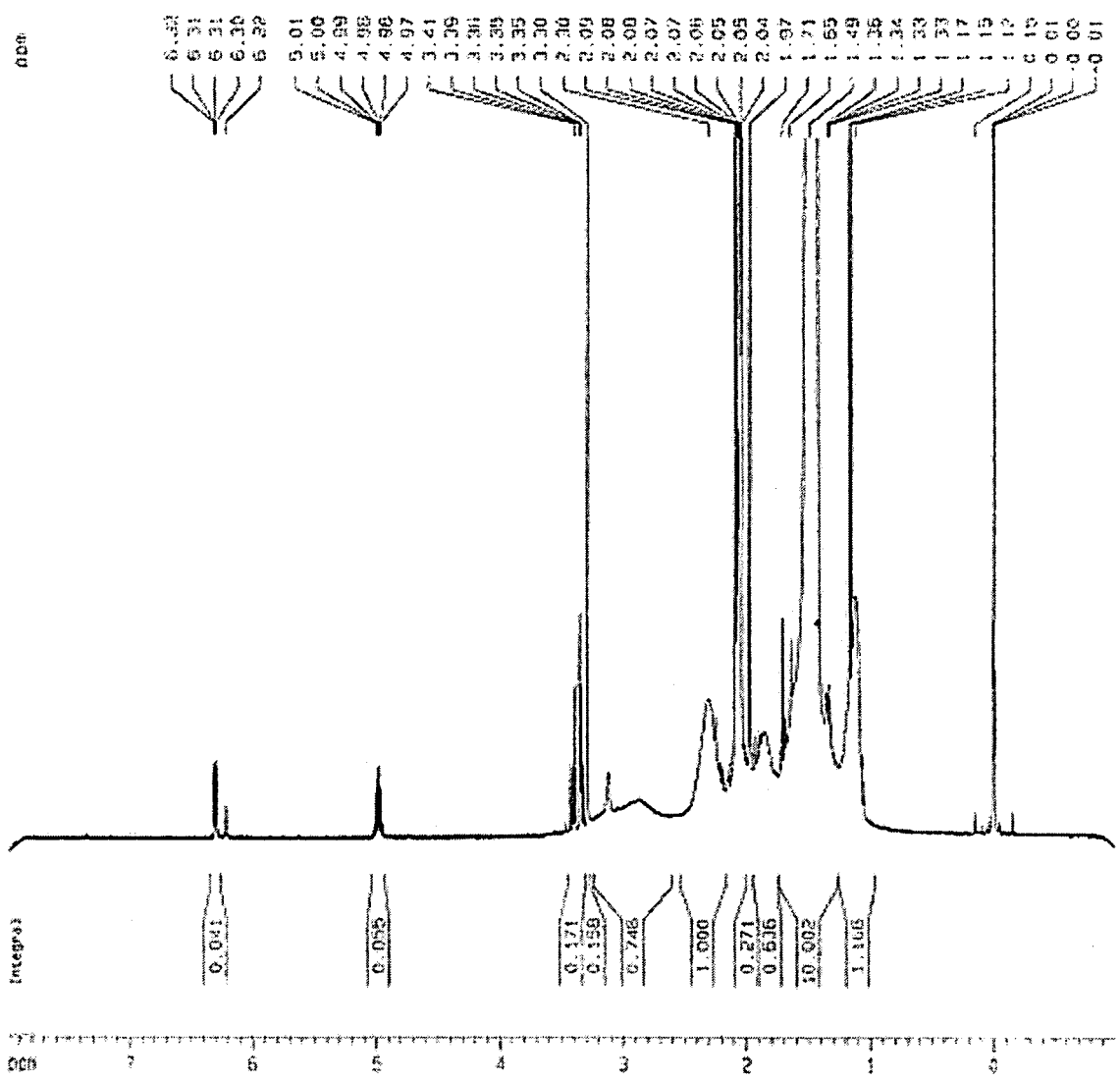
FIG. 1 is a $^1$H-NMR spectrum of a photoacid generating polymer prepared in Example 1 of the disclosure.

The disclosure provides a photoacid generating polymer represented by Formula 1 below:

(1)

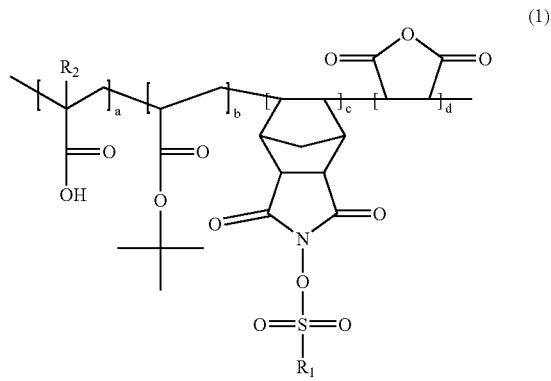

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c and d represent the mole fraction of each monomer and are in the range between about 0.05 and about 0.9, such that the sum of a, b, c, and d equals one.

As the photoacid generating polymer of Formula 1 according to the disclosure, a poly(methylmethacrylic acid-t-butylacrylate-maleic anhydride-N-[(perfluoroalkanesulfonyl)oxy]-norbornene-2,3-dicarboximide) is preferred. Poly (methylmethacrylic acid-t-butylacrylate-maleic anhydride-N-[(perfluorooctanesulfonyl)oxy]-norbornene-2,3-dicarboximide) is particularly preferred.

Since the photoacid generating polymer of the disclosure is not water-soluble, it can be applied to immersion lithography. In addition, the photoacid generating polymer of the disclosure can be used to form a top anti-reflective coating because of its ability to prevent scattered reflection from the top of a photoresist and effectively prevent a photoresist pattern from being disrupted by the scattered reflection.

The photoacid generating polymer of the disclosure has a weight-average molecular weight of about 1,000 to about 1,000,000, and preferably about 1,000 to about 100,000. The molecular weight of the photoacid generating polymer of the present invention is determined considering the desired physical properties, including solubility and reflective index, of an anti-reflective coating to be coated on top of an underlying photoresist in the case where the photoacid generating polymer of the disclosure is used to form the top anti-reflective coating for use in immersion lithography. Too high a molecular weight causes a decrease in the solubility of a developing solution. As a result, a portion of the anti-reflective coating remains on the photoresist even after development, causing pattern contamination. On the other hand, too low a molecular weight cannot ensure an optimized reflective index of the anti-reflective coating and good overcoating on the photoresist.

The disclosure also provides a method for preparing a poly(methylmethacrylic acid-t-butylacrylate-maleic anhydride-N-[(perfluoroalkanesulfonyl)oxy]-norbornene-2,3-dicarboximide) by dissolving a methylmethacrylic acid monomer, a t-butylacrylate monomer, a maleic anhydride monomer, an N-[(perfluoroalkanesulfonyl)oxy]-norbornene-2,3-dicarboximide monomer and a polymerization initiator in an organic solvent, and subjecting the monomers to free-radical polymerization. The free-radical polymerization is preferably carried out at about 57 to about 77° C. for about 2 to about 10 hours.

Examples of organic solvents that can be used in the polymerization include common organic solvents for free-radical polymerization. Preferably, the organic solvent used in the method of the disclosure is selected from the group consisting of acetone, PGMEA, tetrahydrofuran, cyclohexanone, dimethylformamide, dimethylsulfoxide, dioxane, methyl ethyl ketone, ethyl acetate, benzene, toluene, and xylene. Acetone is most preferred.

Further, the polymerization initiator is preferably selected from the group consisting of 2,2'-azobisisobutyronitrile (AIBN), benzoylperoxide, acetylperoxide, laurylperoxide, t-butylperacetate, t-butylhydroperoxide and di-t-butylperoxide. The use of 2,2'-azobisisobutyronitrile (AIBN) is most preferred.

The disclosure also provides a top anti-reflective coating composition usable in immersion lithography comprising a top anti-reflective coating polymer, a photoacid generator, and an organic solvent.

According to the disclosure, the photoacid generator is a photoacid generating polymer represented by Formula 1 below:

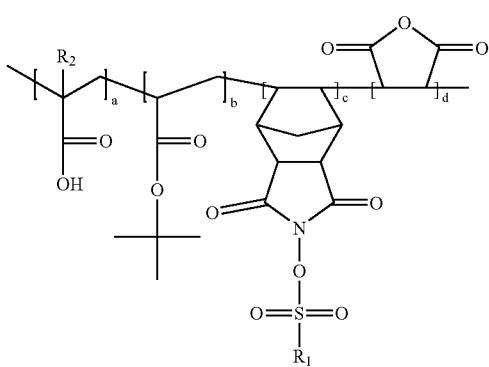

(1)

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c and d represent the mole fraction of each monomer and are in the range between about 0.05 and about 0.9, such that the sum of a, b, c, and d equals one.

When an anti-reflective coating to be formed is dissolved in an immersion solution (e.g., water), the photoacid generator contained in the coating is precipitated, causing contamination of the exposure lens. The photoacid generating polymer of Formula 1 is not water-soluble and, at the same time, sufficiently acts as a photoacid generator, allowing it to be used to prepare a top anti-reflective coating composition for immersion lithography without causing contamination of the exposure lens. In addition, the top anti-reflective coating composition dissolves a portion of a photoacid generator present at the top of an underlying photosensitizer upon pattern formation, thus preventing the top from being formed into a thick section.

As the photoacid generator of Formula 1 contained in the top anti-reflective coating composition, a poly(methylmethacrylic acid-t-butylacrylate-maleic anhydride-N-[(perfluoroalkanesulfonyl)oxy]-norbornene-2,3-dicarboximide) is preferred. Poly(methylmethacrylic acid-t-butylacrylate-maleic anhydride-N-[(perfluorooctanesulfonyl)oxy]-norbornene-2,3-dicarboximide) is particularly preferred.

The top anti-reflective coating composition of the disclosure comprises about 0.1 to about 10 wt % of the photoacid generator, based on the weight of the top anti-reflective coating polymer. When the content of the photoacid generator in the top anti-reflective coating composition is less than about 0.1 wt %, the above-mentioned effects of the photoacid generator cannot be attained. Meanwhile, when the content of the photoacid generator exceeds about 10 wt %, a top anti-reflective coating to be formed absorbs light at 193 nm, significantly impairing the functions of the anti-reflective coating, and the amount of light entering an underlying photosensitizer is decreased and thus a higher exposure energy is required, resulting in a low productivity. Accordingly, the content of the photoacid generator in the top anti-reflective coating composition is preferably limited to about 0.1 to about 10 wt %, based on the weight of the top anti-reflective coating polymer.

Examples of the top anti-reflective coating polymer contained in the top anti-reflective coating composition of the disclosure include polymers having high light transmission such that they can be used in the formation of top anti-reflective coatings. In addition, the top anti-reflective coating polymer is not specially restricted, so long as it is highly soluble in a developing solution after light exposure, thus having no effect on the formation of a pattern, and is water insoluble, thus enabling application to immersion lithography. As the top anti-reflective coating polymer, preferred is a compound having a weight-average molecular weight of about 1,000 to about 1,000,000, represented by Formula 2 below:

Formula 2

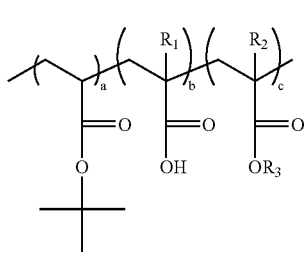

wherein $R_1$ and $R_2$ are independently hydrogen, methyl or fluoromethyl; $R_3$ is a $C_{1-10}$ hydrocarbon or a $C_{1-10}$ hydrocarbon in which the hydrogen atoms are wholly or partly replaced by fluorine atoms; and a, b and c represent the mole fraction of each monomer and are in the range between about 0.05 and about 0.9, such that the sum of a, b, c, and d equals one.

Among compounds that can be represented by Formula 2, preferred top anti-reflective coating polymers usable in the top anti-reflective coating composition of the disclosure are:

a poly(t-butylacrylate-methacrylic acid-2,2,3,4,4,4-hexafluorobutyl methacrylate) represented by Formula 3 below:

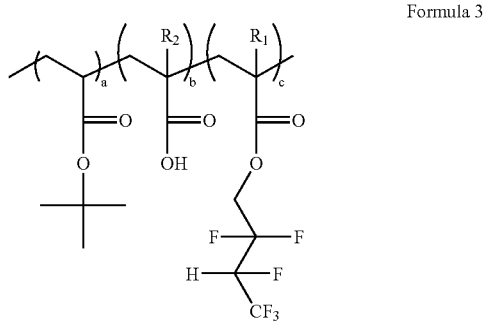

Formula 3 wherein $R_1$ and $R_2$ are independently a methyl group; and a, b and c represent the mole fraction of each monomer and are in the range between about 0.05 and about 0.9, such that the sum of a, b, and c equals one; and a poly(t-butylacrylate-2-(trifluoromethyl)acrylic acid-2,2,3,4,4,4-hexafluorobutyl methacrylate) represented by Formula 4 below:

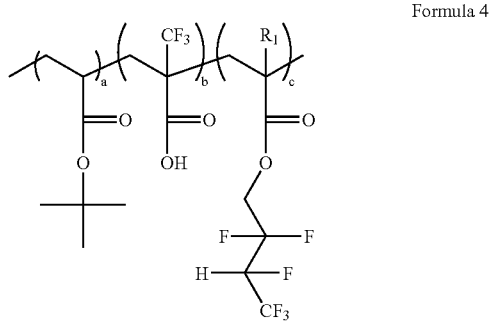

Formula 4 wherein $R_1$ is a methyl group; and a, b and c represent the mole fraction of each monomer and are in the range between about 0.05 and about 0.9, such that the sum of a, b, and c equals one.

Organic solvents for use in the top anti-reflective coating composition of the disclosure are not limited as long as they can dissolve the top anti-reflective coating polymer, the photoacid generating polymer of Formula 1, and the like. Primary alcohols, such as n-butanol, n-pentanol, n-hexanol, n-heptanol and n-octanol, are particularly preferred because they do not dissolve most underlying photosensitizers, preventing mixing between the top anti-reflective coating composition and an underlying photosensitizer when the composition is coated on the photosensitizer. A particularly preferred primary alcohol that can be used in the top anti-reflective coating composition is n-butanol.

Considering the thickness of the anti-reflective coating, the organic solvent is preferably used in an amount of about 1,000 to about 10,000 wt %, based on the weight of the top anti-reflective coating polymer. If the amount of n-butanol is outside this range, the thickness of the anti-reflective coating cannot be optimized.

The top anti-reflective coating composition of the disclosure may further comprise an acid diffusion inhibitor. The acid diffusion inhibitor is not limited as long as it can inhibit diffusion of an acid. L-proline is particularly preferred. The top anti-reflective coating composition of the disclosure may comprise about 1 to about 20 wt % of the acid diffusion inhibitor, based on the weight of the top anti-reflective coating polymer. The acid diffusion inhibitor contained in the top anti-reflective coating composition acts to further inhibit the diffusion of an acid toward the unexposed region.

The top anti-reflective coating composition has an optimal reflective index of about 1.4 to about 2.0. Accordingly, when the top anti-reflective coating composition is overcoated on top of a photoresist, the reflectance can be minimized and thus the photoresist pattern can be protected from being disrupted by reflected light.

The disclosure also provides a method for forming a pattern of a semiconductor device comprising the steps of: (a) applying a photoresist to a semiconductor substrate on which a particular underlying structure is formed; (b) applying a top anti-reflective coating composition on top of the photoresist to form a top anti-reflective coating; (c) exposing the photoresist to light; and (d) developing the photoresist to form a photoresist pattern.

The pattern formation method according to the disclosure is characterized in that the anti-reflective coating formed on top of the photoresist is formed using the top anti-reflective coating composition of the disclosure. Since the top anti-reflective coating thus formed has a reflective index of about 1.4 to about 2.0, the reflection at the top of the photoresist can be minimized. Accordingly, the photoresist pattern formed by the method of the disclosure has greatly improved pattern uniformity.

According to the pattern formation method of the disclosure, baking may be carried out before and/or after light exposure. The baking is preferably carried out at about 70° C. to about 200° C.

The anti-reflective coating composition and the pattern formation method of the disclosure are applicable to a process for forming an ultrafine pattern using an ArF light source (193 nm). Likewise, they can also be applied to a process for forming an ultrafine pattern using a light source (e.g., F2 or EUV) having a shorter wavelength, so long as water can be used as a medium for the light source. The light exposure using the light source is preferably achieved with an exposure energy of about 0.1 to about 50 mJ/cm$^2$.

In the pattern formation method of the disclosure, the developing can be carried out using an alkaline developing solution. As a preferred alkaline developing solution, an about 0.01 to about 5% (w/w) solution of tetramethylammoniumhydroxide (TMAH) in water is used.

The disclosure also provides the use of a top anti-reflective coating composition in the fabrication of a semiconductor device. Since the top anti-reflective coating composition of the disclosure can minimize scattered reflection, it can be applied to various processes for fabricating semiconductor devices, in addition to the formation process of an ultrafine pattern.

It can be appreciated that the top anti-reflective coating composition of the disclosure can be applied to a variety of processes in ways obvious to those skilled in the art, depending on the type of the processes.

The disclosure will now be described in more detail with reference to the following examples. However, these examples are given for the purpose of illustration and are not to be construed as limiting the scope of the invention.

EXAMPLES

Example 1

Preparation of a Photoacid Generating Polymer: poly(methylmethacrylic acid-t-butylacrylate-maleic anhydride-N-[(perfluorooctanesulfonyl)oxy]-norbornene-2,3-dicarboximide)

2.0 g of methylmethacryilic acid, 9.0 g of t-butylacrylate, 1.0 g of maleic anhydride, 1.2 g of N-[(perfluorooctanesulfonyl)oxy]-norbornene-2,3-dicarboximide and 0.5 g of AIBN were dissolved in 50 g of acetone. The monomers were polymerized at 67° C. for 6 hours. After completion of the polymerization, the polymerized product was precipitated in water, filtered, and dried in a vacuum to give poly(methylmethacrylic acid-t-butylacrylate-maleic anhydride-N-[(perfluorooctanesulfonyl)oxy]-norbornene-2,3-dicarboximide) in a yield of 78%. The structure of the polymer was identified by $^1$H-NMR spectroscopy (FIG. 1).

Example 2

Preparation of a Top Anti-Reflective Coating Composition and Pattern Formation 1.0 g of a poly(t-butylacrylate-methacrylic acid-2,2,3,4,4,4-hexafluorobutyl methacrylate) represented by Formula 3 below and 0.2 g of the poly(methylmethacrylic acid-t-butylacrylate-maleic anhydride-N-[(perfluorooctanesulfonyl)oxy]-norbornene-2,3-dicarboximide) as prepared in Example 1 were dissolved in 70 g of n-butanol to give a top anti-reflective coating composition for immersion lithography.

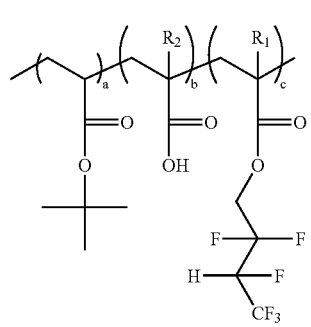

(3)

wherein $R_1$ and $R_2$ are independently a methyl group; and a, b and c represent the mole fraction of each monomer and are in the range between about 0.05 and about 0.9, such that the sum of a, b, and c equals one.

Figure 2:
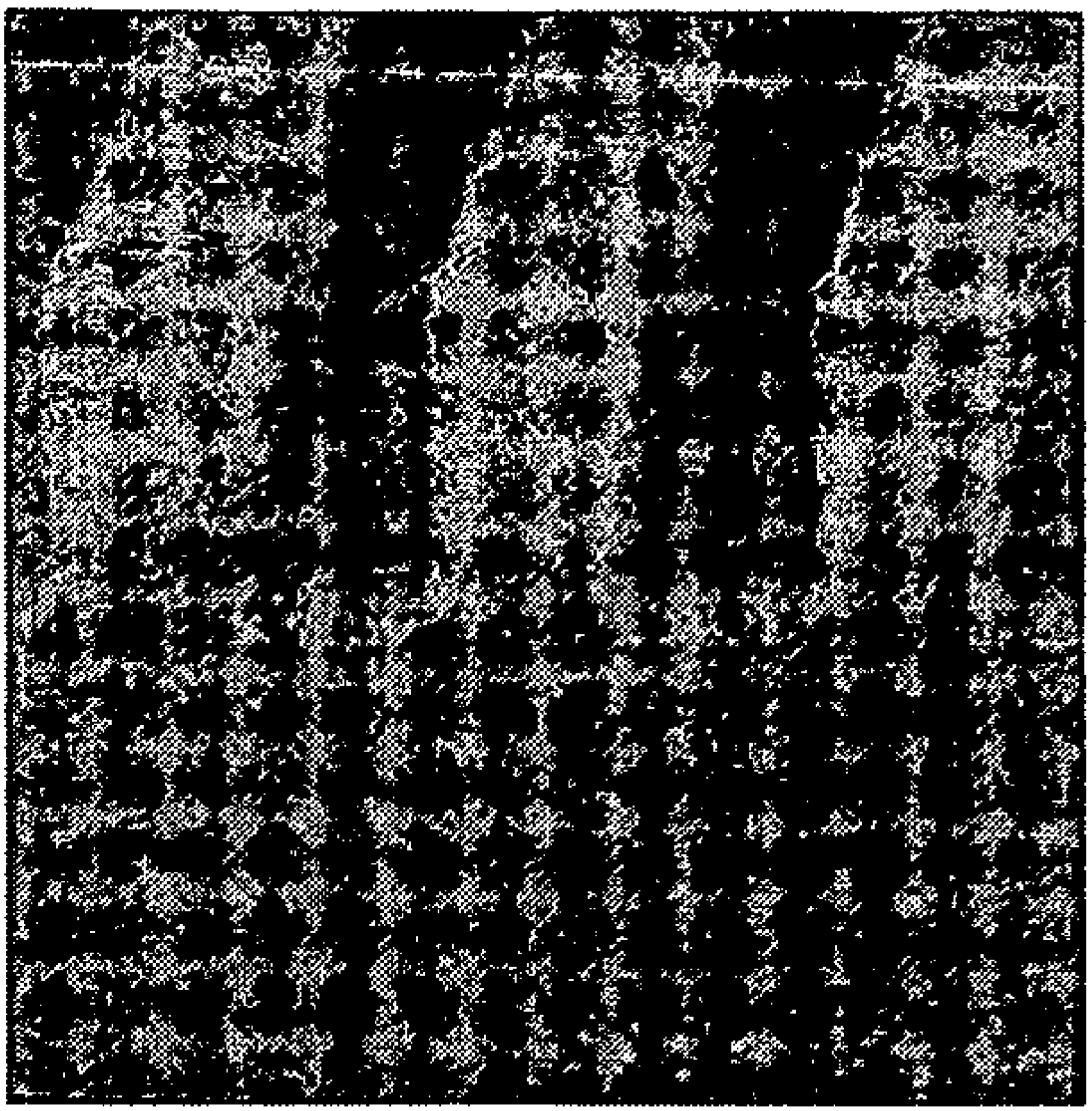
FIG. 2 is an 80 nm-L/S image of a semiconductor pattern formed using a top anti-reflective coating composition prepared in Example 2 of the disclosure.

A photosensitizer (AR1221J, JSR) was coated to a thickness of 200 nm on a wafer, and baked at 130° C. for 90 seconds. The top anti-reflective coating composition was coated at 3,000 rpm on the coated photosensitizer. To confirm whether the top anti-reflective coating composition of the disclosure could function as a protective film of the photosensitizer against water after the coating, the wafer was immersed in water for 3 minutes. After exposing the wafer to light using ArF exposure equipment, the exposed wafer was baked at 130° C. for 90 seconds and developed to form a pattern. An image of the pattern is shown in FIG. 2. This image indicates that the pattern formed using the top anti-reflective coating was vertically formed.

Since the photoacid generating polymer of the disclosure is not water-soluble and at the same time acts as a photoacid generator, it can be used to prepare a top anti-reflective coating composition for immersion lithography.

In addition, the top anti-reflective coating formed using the anti-reflective coating composition comprising the photoacid generating polymer of the disclosure satisfies the following requirements for use in immersion lithography. It has a light transmission of 96% or higher, making it is transparent to a light source. It has a refractive index between about 1.4 and about 2.0. It does not dissolve an underlying photosensitizer and is not soluble in water upon light exposure, but is highly soluble in a developing solution. Finally, it enables the formation of a vertical pattern on a photoresist.

When the anti-reflective coating composition comprising the photoacid generating polymer of the disclosure is used to form a pattern, it dissolves a portion of a photoacid generator present at the top of an underlying photosensitizer, thus preventing the top from being formed into a thick section. Therefore, the use of the anti-reflective coating composition of the disclosure enables the formation of a vertical pattern on a semiconductor device. Since the top anti-reflective coating composition of the disclosure enables the formation of a fine photoresist pattern, it contributes to the fabrication of sub-50 nm semiconductor devices in an efficient manner.

Although the preferred embodiments have been set forth for illustrative purposes, those skilled in the art will appreciate that various modifications, additions and substitutions are possible, without departing from the scope and spirit of this disclosure and the accompanying claims.

What is claimed is:

1. A photoacid generating polymer represented by Formula 1 below:

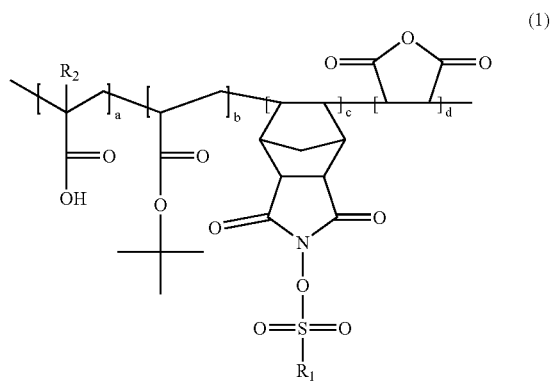

(1)

wherein $R_1$ is a $C_{1-10}$ hydrocarbon or a $C_{1-10}$ hydrocarbon in which the hydrogen atoms are wholly or partly replaced by fluorine atoms; $R_2$ is hydrogen or a methyl group; and a, b, c, and d represent the mole fraction of each monomer and are in the range between about 0.05 and about 0.9, such that the sum of a, b, c, and d equals one.

2. The polymer according to claim 1, wherein the polymer has a weight-average molecular weight of about 1,000 to about 100,000.

3. The polymer according to claim 1, wherein the polymer is a poly(methylmethacrylic acid-t-butylacrylate-maleic anhydride-N-[(perfluoroalkanesulfonyl)oxy]-norbornene-2,3-dicarboximide).

4. The polymer according to claim 3, wherein the polymer is poly(methylmethacrylic acid-t-butylacrylate-maleic anhydride-N-[(perfluorooctanesulfonyl)oxy]-norbornene-2,3-dicarboximide).

5. A method for preparing a poly(methylmethacrylic acid-t-butylacrylate-maleic anhydride-N-[(perfluoroalkanesulfonyl)oxy]-norbornene-2,3-dicarboximide) comprising:
(1) dissolving a methylmethacrylic acid monomer, a t-butylacrylate monomer, a maleic anhydride monomer, an N-[(perfluoroalkanesulfonyl)oxy]-norbornene-2,3-dicarboximide monomer and a polymerization initiator in an organic solvent, and
(2) subjecting the monomers to free-radical polymerization.

6. The method according to claim 5, comprising carrying out the free-radical polymerization at about 57° C. to about 77° C. for about 2 hours to about 10 hours.

7. The method according to claim 5, wherein the organic solvent is a solvent selected from the group consisting of acetone, PGMEA, tetrahydrofuran, cyclohexanone, dimethylformamide, dimethylsulfoxide, dioxane, methyl ethyl ketone, ethylacetate, benzene, toluene, xylene, and combinations thereof.

8. The method according to claim 5, wherein the polymerization initiator is selected from the group consisting of 2,2'-azobisisobutyronitrile (AIBN), benzoylperoxide, acetylperoxide, laurylperoxide, t-butylperacetate, t-butylhydroperoxide, and di-t-butylperoxide.

9. A top anti-reflective coating composition comprising:
a photoacid generating polymer represented by Formula 1 below:

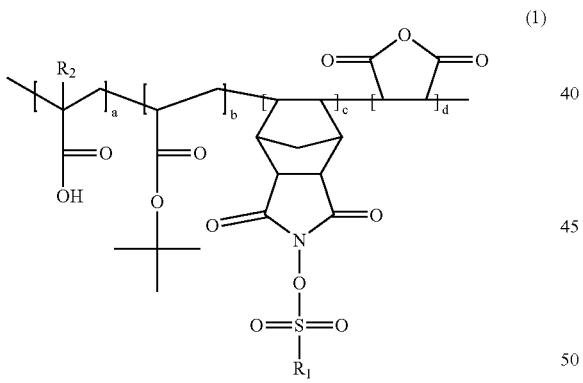

(1)

wherein $R_1$ is a $C_{1-10}$ hydrocarbon in which the hydrogen atoms are wholly or partly replaced by fluorine atoms; $R_2$ is hydrogen or a methyl group; and a, b, c, and d represent the mole fraction of each monomer and are in the range between about 0.05 and about 0.9, such that the sum of a, b, c, and d equals one;
a top anti-reflective coating polymer; and
an organic solvent.

10. The composition according to claim 9, wherein the photoacid generating polymer is a poly(methylmethacrylic acid-t-butylacrylate-maleic anhydride-N-[(perfluoroalkanesulfonyl)oxy]-norbornene-2,3-dicarboximide).

11. The composition according to claim 10, wherein the photoacid generating polymer is poly(methylmethacrylic acid-butylacrylate-maleic anhydride-N-[(perfluorooctanesulfonyl)oxy]-norbornene2,3-dicarboximide.

12. The composition according to claim 9, wherein the composition comprises about 0.1 wt % to about 10 wt % of the photoacid generator, based on the weight of the top anti-reflective coating polymer.

13. The composition according to claim 9, wherein the top anti-reflective coating polymer is a compound having a weight-average molecular weight of about 1,000 to about 1,000,000, represented by Formula 2 below:

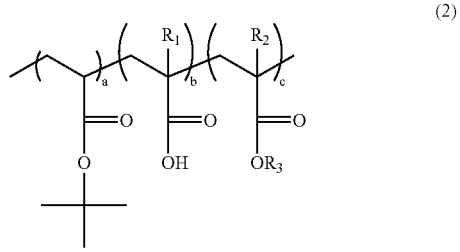

(2)

wherein $R_1$ and $R_2$ are independently hydrogen, methyl or fluoromethyl; $R_3$ is a $C_{1-10}$ hydrocarbon or a $C_{1-10}$ hydrocarbon in which the hydrogen atoms are wholly or partly replaced by fluorine atoms; and a, b, and c represent the mole fraction of each monomer and are in the range between about 0.05 and about 0.9, such that the sum of a, b and c equals one.

14. The composition according to claim 13, wherein the top anti-reflective coating polymer is a poly(t-butyl acrylate-methacrylic acid-2,2,3,4,4,4-hexafluorobutyl methacrylate) represented by Formula 3 below:

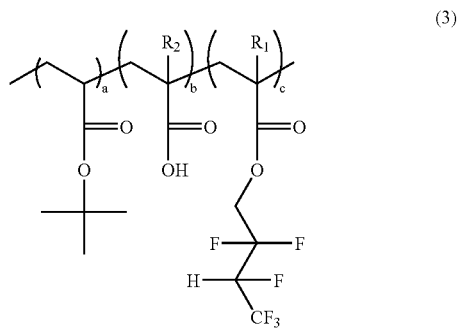

(3)

wherein $R_1$ and $R_2$ are independently a methyl group; and a, b, and c represent the mole fraction of each monomer and are in the range between about 0.05 and about 0.9, such that the sum of a, b, and c equals one; or
a poly(t-butylacrylate-2-(trifluoromethyl)acrylic acid-2,2,3,4,4,4-hexafluorobutyl methacrylate) represented by Formula 4 below:

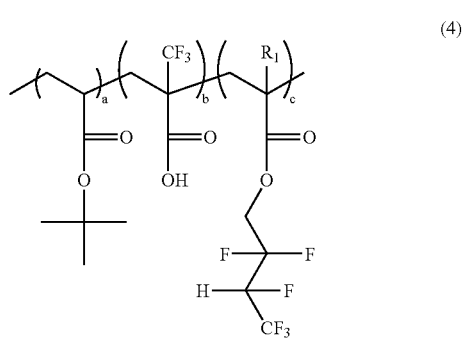

(4)

wherein $R_1$ is a methyl group; and a, b, and c represent the mole fraction of each monomer and are in the range between about 0.05 and about 0.9, such that the sum of a, b, and c equals one.

15. The composition according to claim 9, wherein the organic solvent is a primary alcohol.

16. The composition according to claim 15, wherein the primary alcohol is n-butanol.

17. The composition according to claim 9, wherein the composition is prepared by dissolving the top anti-reflective coating polymer in about 1,000 wt % to about 10,000 wt % of the organic solvent, based on the weight of the polymer.

18. The composition according to claim 9, further comprising an acid diffusion inhibitor.

19. The composition according to claim 18, wherein the acid diffusion inhibitor is L-proline.

20. The composition according to claim 18, wherein the composition comprises about 1 wt % to about 20 wt % of the acid diffusion inhibitor, based on the weight of the top anti-reflective coating polymer.

21. The composition according to claim 9, wherein the composition has a refractive index between about 1.4 and about 2.0.

22. A method for forming a pattern of a semiconductor device, comprising the steps of:
(a) applying a photoresist to a semiconductor substrate on which a particular underlying structure is formed;
(b) applying a top anti-reflective coating composition according to claim 9 on top of the photoresist to form a top anti-reflective coating;
(c) exposing the photoresist to light by passing light through a medium onto the photoresist; and
(d) developing the photoresist to form a photoresist pattern.

23. The method according to claim 22, comprising carrying out a baking step before and/or after the exposure step.

24. The method according to claim 23, comprising carrying out the baking step at about 70° C. to about 200° C.

25. The method according to claim 22, comprising using water as the medium for a light source in the light exposure step.

26. The method according to claim 22, comprising carrying out the developing step using an about 0.01% to about 5% (w/w) solution of tetramethylammoniumhydroxide (TMAH) in water as a developing solution.

* * * * *